(12) United States Patent
van Zyl

(10) Patent No.: US 7,970,562 B2
(45) Date of Patent: Jun. 28, 2011

(54) SYSTEM, METHOD, AND APPARATUS FOR MONITORING POWER

(75) Inventor: Gideon J. van Zyl, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 488 days.

(21) Appl. No.: 12/116,375

(22) Filed: May 7, 2008

(65) Prior Publication Data

US 2009/0281741 A1    Nov. 12, 2009

(51) Int. Cl.
*G01R 21/00* (2006.01)

(52) U.S. Cl. ............ 702/60; 702/57; 702/106; 702/182; 702/183; 702/189; 702/198; 702/199; 315/111.21; 315/111.51; 118/723 E

(58) Field of Classification Search .............. 702/57, 702/60, 106, 182, 183, 189, 198, 199; 315/111.21, 315/111.51; 118/723 E, 723 I
See application file for complete search history.

(56) References Cited

U.S. PATENT DOCUMENTS

| | | | |
|---|---|---|---|
| 5,175,472 A | 12/1992 | Johnson, Jr. | |
| 5,195,045 A | 3/1993 | Keane | |
| 5,325,019 A | 6/1994 | Miller | |
| 5,467,013 A | 11/1995 | Williams | |
| 5,523,955 A | 6/1996 | Heckman | |
| 5,576,629 A | 11/1996 | Turner | |
| 5,667,701 A | 9/1997 | Sato | |
| 5,688,357 A | 11/1997 | Hanawa | |
| 5,705,931 A | 1/1998 | Klick | |
| 5,770,922 A | 6/1998 | Gerrish | |
| 5,808,415 A | 9/1998 | Hopkins | |
| 5,824,606 A | 10/1998 | Dible | |
| 5,834,931 A | 11/1998 | Moore | |
| 6,046,594 A * | 4/2000 | Mavretic | ........................ 324/520 |
| 6,060,837 A | 5/2000 | Richardson | |
| 6,252,354 B1 | 6/2001 | Collins | |
| 6,259,334 B1 | 7/2001 | Howald | |
| 6,440,260 B1 | 8/2002 | Denda | |
| 6,447,691 B1 | 9/2002 | Denda | |
| 6,449,568 B1 | 9/2002 | Gerrish | |
| 6,522,121 B2 | 2/2003 | Coumou | |
| 6,608,446 B1 | 8/2003 | Coumou | |
| 6,610,169 B2 | 8/2003 | Nguyen | |
| 6,657,394 B2 * | 12/2003 | Nasman | ................... 315/111.21 |
| 6,661,324 B1 | 12/2003 | Gilmore | |
| 6,677,711 B2 | 1/2004 | MacGearailt | |
| 6,677,828 B1 | 1/2004 | Harnett | |
| 6,707,255 B2 | 3/2004 | Coumou | |
| 6,708,123 B2 | 3/2004 | Gerrish | |

(Continued)

*Primary Examiner* — Sujoy K Kundu
(74) *Attorney, Agent, or Firm* — Neugeboren O'Dowd PC; Sean R. O'Dowd

(57) ABSTRACT

A system, method and apparatus for monitoring a processing system is disclosed. The method includes obtaining N parameter-value pairs that include a first parameter value and a second parameter value; obtaining, for each parameter-value pair, the product of the first parameter value and the complex conjugate of the second parameter value to obtain N products defined by a real part and an imaginary part; obtaining, for each parameter-value pair, a product of the second parameter value and the complex conjugate of the second parameter value to obtain N real numbers; calculating an average reflection coefficient by dividing an imaginary number by an average of the N real numbers, the real component of the imaginary number being equal to the average of the real parts of the N products and the imaginary part of the imaginary number being equal to an average of the imaginary parts of the N products.

12 Claims, 9 Drawing Sheets

U.S. PATENT DOCUMENTS

| | | |
|---|---|---|
| 6,727,655 B2 | 4/2004 | McChesney |
| 6,781,317 B1 | 8/2004 | Goodman |
| 6,791,274 B1 | 9/2004 | Hauer |
| 6,792,889 B2 | 9/2004 | Nakano |
| 6,819,096 B2 | 11/2004 | Gonzalez |
| 6,873,114 B2 | 3/2005 | Avoyan |
| 6,887,339 B1 | 5/2005 | Goodman |
| 6,970,700 B1 | 11/2005 | Keane |
| 6,972,524 B1 | 12/2005 | Marakhtanov |
| 6,983,215 B2 | 1/2006 | Coumou |
| 7,015,414 B2 | 3/2006 | Mitrovic |
| 7,019,543 B2 | 3/2006 | Quon |
| 7,084,369 B2 | 8/2006 | Sosnowski |
| 7,122,965 B2 | 10/2006 | Goodman |
| 7,316,764 B2 | 1/2008 | Baldwin |
| 7,326,872 B2 | 2/2008 | Shannon |
| 2003/0213559 A1 | 11/2003 | Goodman |
| 2004/0150386 A1 | 8/2004 | Gonzalez |
| 2005/0093459 A1 | 5/2005 | Kishinevsky |
| 2005/0184668 A1 | 8/2005 | Parsons |
| 2006/0170367 A1 | 8/2006 | Bhutta |
| 2006/0220574 A1 | 10/2006 | Ogawa |
| 2006/0226786 A1 | 10/2006 | Lin |
| 2006/0239389 A1 | 10/2006 | Coumou |
| 2006/0262889 A1 | 11/2006 | Kalvaitis |
| 2007/0024362 A1 | 2/2007 | Radomski |
| 2007/0082627 A1 | 4/2007 | Church, Jr. |
| 2007/0288125 A1 | 12/2007 | Quaratiello |
| 2008/0227420 A1 | 9/2008 | Choueiry |

* cited by examiner

SYSTEM, METHOD, AND APPARATUS FOR MONITORING POWER

FIELD OF THE INVENTION

This invention relates generally to apparatus and methods for plasma processing, and more particularly to apparatus and methods for monitoring parameters of plasma processing systems.

BACKGROUND OF THE INVENTION

In plasma processing applications, such as the manufacture of semiconductors or flat panel displays, RF power generators apply a voltage to a load in a plasma chamber and may operate over a wide range of frequencies. The impedance of a processing plasma can vary with the frequency of this applied voltage, chamber pressure, gas composition, and the target or substrate material. And the impedance of the plasma load affects the efficiency at which power is applied from the generator to the load. Consequently, an estimate of the plasma load impedance is a parameter that is often desirable for users to have available.

Obtaining a good estimate of load impedance, however, is often difficult. For example, accurate measurements of forward and reflected power, more precisely the incident and reflected signals who's magnitudes squared are proportional to forward and reflected power, as well as the phase relationship between the forward and reflected signals may be utilized to obtain an estimate of load impedance, but when the measurement system (the measurement system to obtain forward and reflected signals) is not synchronized with a reference oscillator (e.g., an oscillator of the RF generator), each sampled measurement of forward and reflected power may potentially have a random phase with respect to the reference oscillator. As a consequence, it is very difficult, if not impossible, to average either the forward voltage or the reflected voltage measurements (e.g., to remove noise and unwanted modulation).

To illustrate the problem, consider a simple measurement system such as shown in FIG. 1A containing a sensor such as a directional coupler or voltage/current (VI) sensor. It can be shown that almost any linear four port network can be used as a sensor for determining forward and reflected power as well as load impedance. Such a sensor is perfectly correctable in the sense that there are four complex numbers such that $$\begin{bmatrix} V_{forward} \\ V_{reflected} \end{bmatrix} = \begin{bmatrix} k_{11} & k_{12} \\ k_{21} & k_{22} \end{bmatrix} \begin{bmatrix} V_3 \\ V_4 \end{bmatrix}$$

as long as $$S_{13}, S_{24} \neq S_{14}, S_{23}$$

where $S_{ij}$, $i, j \in \{1,2\}$ are the scattering parameters (S parameters) of the sensor with the ports numbered as in FIG. 1A. In the above matrix equation $V_{forward}$ and $V_{reflected}$ are the corrected forward and reflected signals with respect to a 50'Ω reference impedance such that the forward power is equal to $|V_{forward}|^2$, the reflected power is equal to $|V_{reflected}|^2$ and the load reflection coefficient, $\rho_{load}$, is equal to $V_{reflected}/V_{forward}$. The load reflection coefficient in turn is related to the load impedance by $$Z_{load} = 50 \frac{1 + \rho_{load}}{1 - \rho_{load}}.$$

The entries in the matrix, $k_{11}$, $k_{12}$, $k_{21}$ and $k_{22}$ can be calculated from the scattering parameters of the sensor and the impedance presented to the sensor at the sense ports. Any one of the entries, typically $k_{11}$ can be made real by multiplying through with a suitable complex number. Normally the entries are determined by calibrating the entire system. Such calibration can be performed by measuring the response of the sensor system to at least three impedances and using a power standard to scale the matrix correctly. Note that all numbers involved are complex numbers representing the magnitude and phase of the signals in a convenient mathematical form. Thus, with t representing time and choosing an arbitrary instant in time to correspond to t=0, the signal $V_3$ in the matrix equation is related to the time domain signal at port 3 of the sensor, v3, by the equation:

$$v_3(t) = V_3 e^{j\omega_0 t} + V^*_3 e^{-j\omega_0 t}$$

where $\omega_0$ is the frequency of the source in rad/s and x* represents the complex conjugate of x. The same holds true for $V_4$, $V_{forward}$ and $V_{reflected}$. As shown in FIG. 1A estimates of $V_3$ and $V_4$ can be obtained by simply taking samples of $v_3$ and $v_4$ 90 degrees apart with 90 degrees corresponding to a delay of one fourth of the period of the source. A simple measurement system such as shown in FIG. 1A assumes a pure sinusoidal source. In general, a more complex system incorporating filters and more sophisticated and less noisy estimates of the phasors $V_3$ and $V_4$ are used. As illustrated in FIGS. 1B and 1C, unless the samples to estimate $V_3$ and $V_4$ are perfectly synchronized with the frequency of the source, samples of $V_3$ and $V_4$ taken at different times are rotated. In FIG. 1B, $a(1)+jb(1)$ illustrates a sample of $V_3$ taken at time $t_1$, $c(1)+jd(1)$ illustrates a sample of $V_4$ taken at time $t_1$, and in FIG. 1C, $a(2)+jb(2)$ illustrates a sample of $V_3$ taken at time $t_2$, and $c(2)+jd(2)$ illustrates a sample of $V_4$ taken at time $t_2$.

As shown in this illustration, the magnitudes of the samples of $V_3$ and $V_4$ and well as the phase relationship between $V_3$ and $V_4$ are determined by the power delivered to the load and the load impedance and do not change under steady state excitation, but the samples are rotated with respect to each other except in the special case where the sampling times are perfectly synchronized with the frequency of the source and taken exactly one or multiples of one cycle apart. The same is true for samples of the corrected forward and reflected signals $V_{forward}$ and $V_{reflected}$. If averaging is used it can be applied to either the uncorrected signals $V_3$ and $V_4$ or the corrected signals $V_{forward}$ and $V_{reflected}$. The choice between averaging depends on the available computational resources. It is often possible to calculate the corrected signals and carry out averaging on the corrected signals, but if computational resources are really limited it may be more advantageous to average the uncorrected signals $V_3$ and $V_4$ and perform slightly more computations at a much reduced rate to obtain the corrected signals from the averaged uncorrected signals.

One approach to deal with the problem of random phase in power measurements includes calculating, for each sampled pair of forward and reflected signals, a reflection coefficient, which is equal to the ratio of the reflected signal to the forward signal. Then the set of calculated reflection coefficients is averaged to obtain an average reflection coefficient value. For example, in one millisecond, a thousand measurements of forward and reflected signals may be taken, and as a consequence, a thousand division operations (e.g., uncorrected reflected signal $V_4(k)$ divided by uncorrected forward signal $V_3(k)$, $k\in\{1, 2, \ldots\}$) are carried out in each millisecond to obtain a set of reflection coefficient values that are then averaged to obtain an average reflection coefficient. Problematically, each time a reflection coefficient is calculated in this manner, system resources are utilized; thus this approach to obtaining an average reflection coefficient is computationally intensive and is prone to excessive utilization of system resources.

As a consequence, known techniques are often too inefficient to provide desirable information about the electrical characteristics of plasma loads. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Embodiments of the present invention can provide a system, method and apparatus for monitoring a processing system. The method, for example, may include sampling RF power that is applied to a plasma load to obtain N parameter-value pairs, each of the parameter-value pairs including a first parameter value and a second parameter value; obtaining, for each parameter-value pair, the product of the first parameter value and the complex conjugate of the second parameter value to obtain N products, each of the N products defined by a real part and an imaginary part; obtaining, for each parameter-value pair, a product of the second parameter value and the complex conjugate of the second parameter value to obtain N real numbers; calculating an average reflection coefficient $\Gamma$, the average reflection coefficient $\Gamma$ being defined by the equation:

$$\Gamma = \frac{<a> + <b>j}{<r>}$$

wherein $<a>$ is an average of the real parts of the N products, $<b>$ is an average of the imaginary parts of the N products and $<r>$ is an average of the N real numbers; and utilizing the average reflection coefficient $\Gamma$ to manage the processing system.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1A:
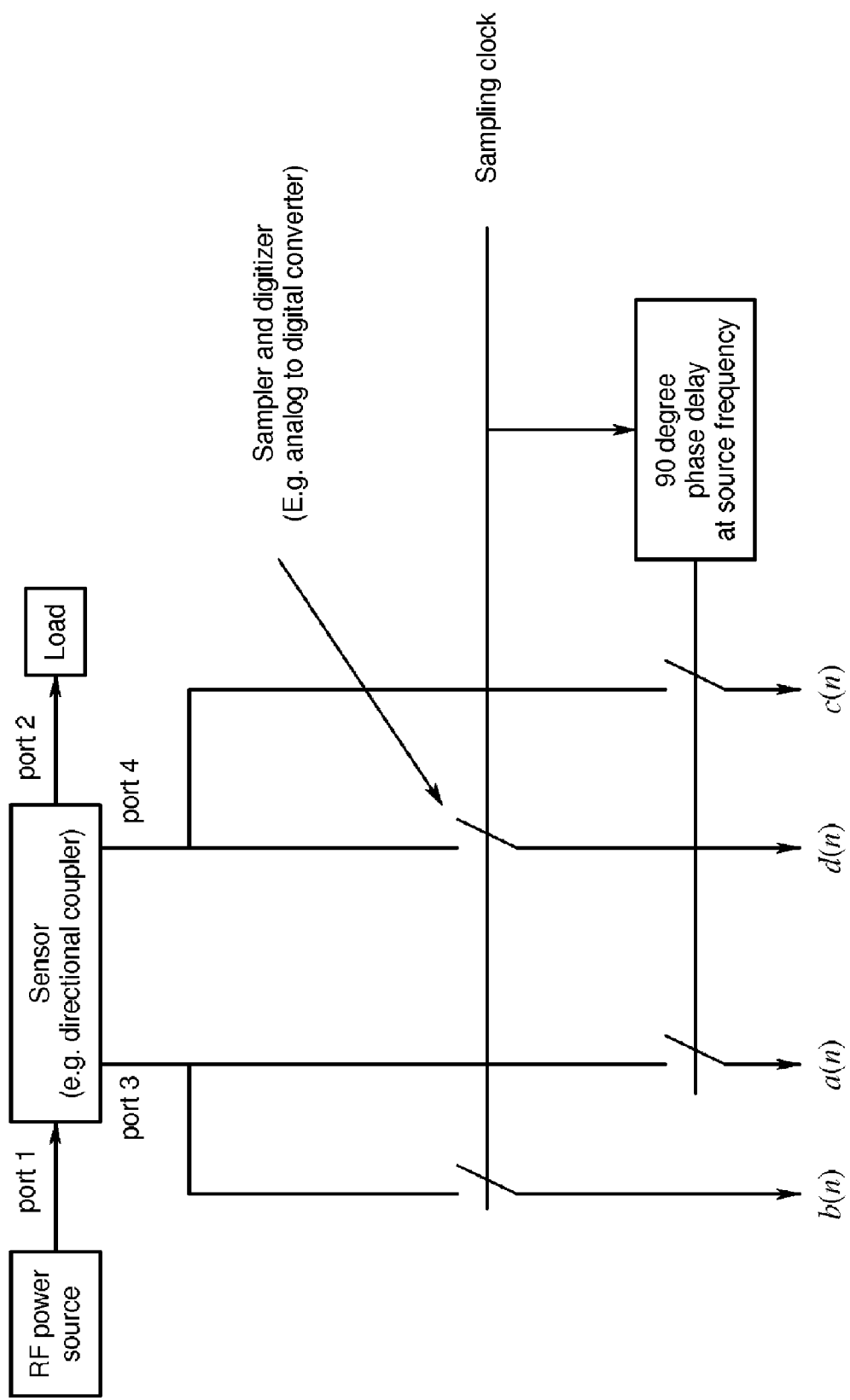
FIGS. 1A, 1B, and 1C are a block diagram of a simple measurement system, a graph depicting voltage samples taken with the system of FIG. 1A at a first time, and a graph depicting voltage samples taken with the system of FIG. 1A at a second time, respectively.
Figure 1C:
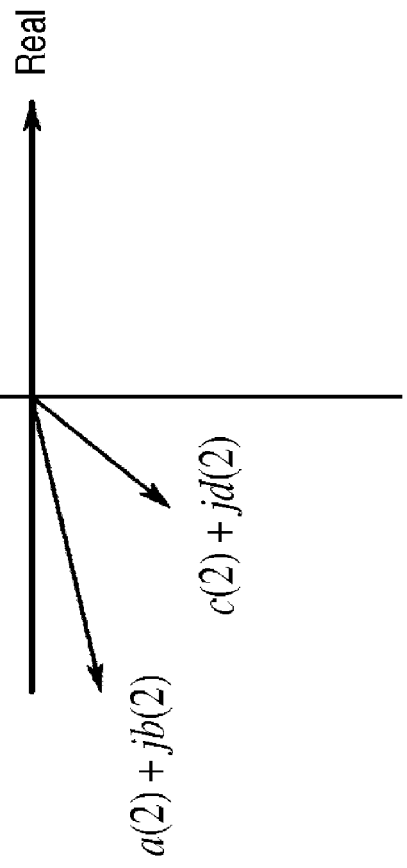
Figure 1B:
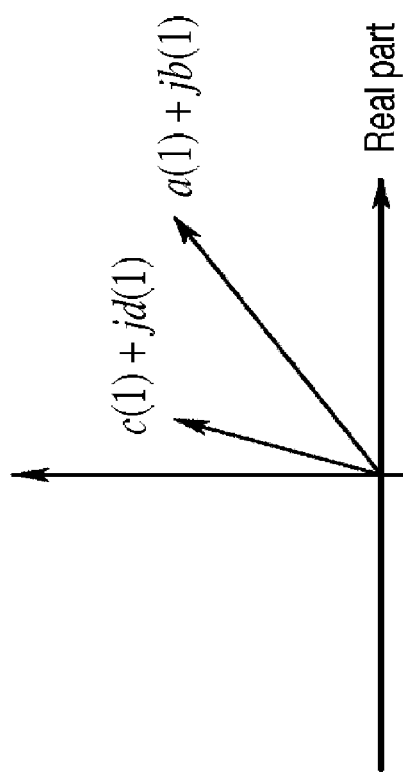
Figure 2:
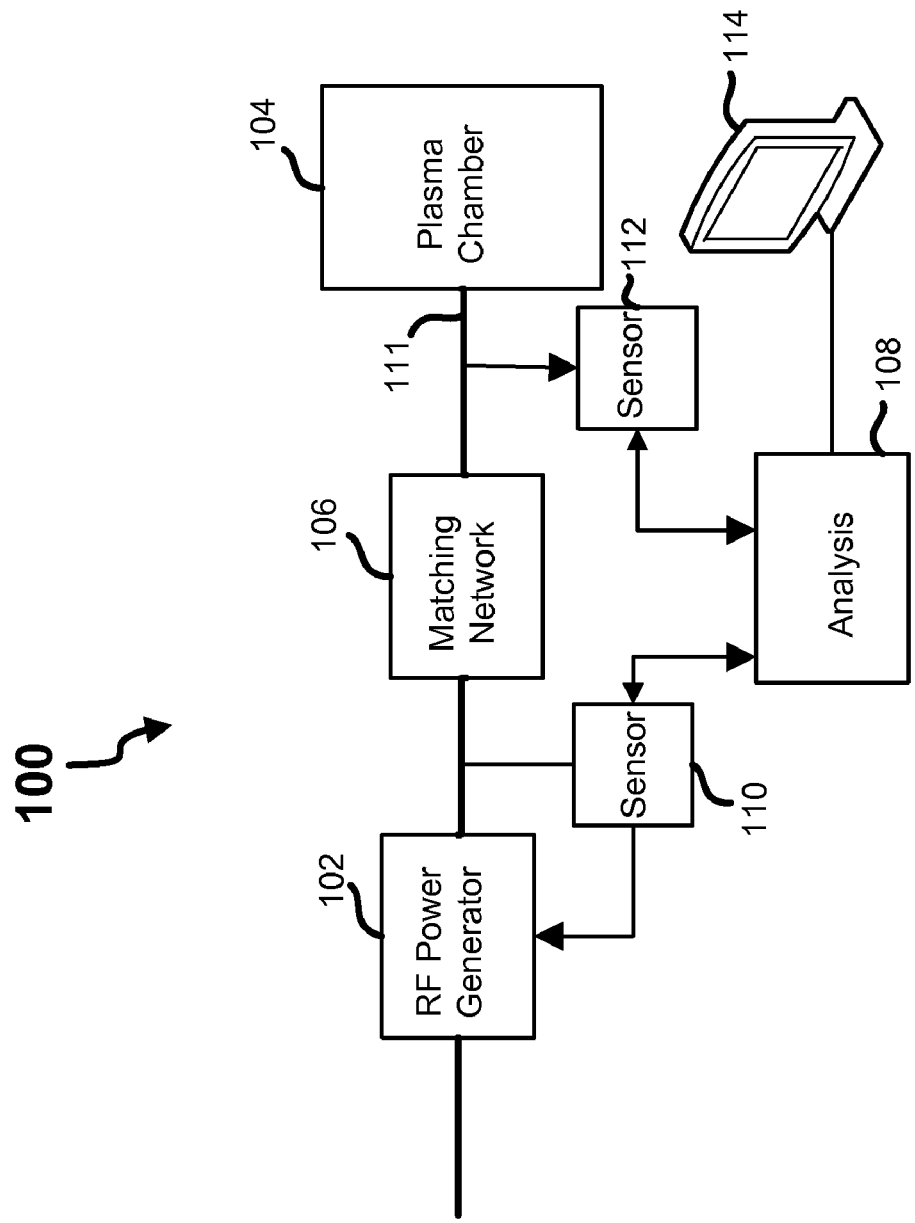
FIG. 2 is a block diagram depicting a plasma processing environment in which several embodiments of the invention may be implemented.

Referring now to the drawings, where like or similar elements are designated with identical reference numerals throughout the several views, and referring in particular to FIG. 2, it is a block diagram depicting a plasma processing environment 100 in which several embodiments of the invention may be implemented. As shown, a radio frequency (RF) generator 102 is coupled to a plasma chamber 104 via an impedance matching network 106, and an analysis portion 108 is disposed to receive an input from a first sensor 110 that is coupled to an output of the RF generator 102 and in input from a second sensor 112 that is coupled to an input of the plasma chamber 104. As depicted, the analysis portion 108 is also coupled to a man-machine interface 114, which may include a keyboard, display and pointing device (e.g., a mouse).

The illustrated arrangement of these components is logical and not meant to be an actual hardware diagram; thus, the components can be combined or further separated in an actual implementation. For example, the functionality of one or both of the sensors 110, 112 may be implemented with components of the analysis portion 108, the sensor 110 may be entirely contained within a housing of the generator 102, and in some implementations, either of the sensors 110, 112 may be omitted from the system 100. Moreover, it should be recognized that the components included in FIG. 2 depict an exemplary implementation, and in other embodiments, as discussed further herein, some components may be omitted and/or other components added.

The RF power generator 102 generally provides RF power to the plasma chamber 104 to ignite and sustain a plasma in the chamber 104 for plasma processing. Although not required, in many embodiments the RF generator 102 is realized by a collection of two or more RF generators, and each of the RF generators provides power at a different frequency. Although certainly not required, the RF generator 102 may be realized by one or more PARAMOUNT model RF generators available from Advanced Energy Incorporated in Fort Collins, Colo.

The matching network 106 in this embodiment is generally configured to transform the chamber impedance, which can vary with the frequency of this applied voltage, chamber pressure, gas composition, and the target or substrate material, to an ideal load for the RF power generator 102. One of ordinary skill in the art will appreciate that a variety of different matching network types may be utilized for this purpose. The matching network 106 may be realized by a NAVIGATOR model digital impedance matching network available from Advanced Energy Incorporated in Fort Collins, Colo., but other impendence matching networks may also be utilized.

The first sensor 110 in this embodiment is generally configured to measure one or more parameters of the power applied by the generator (e.g., forward power, reflected power, voltage, and/or current). As discussed further herein, the measured parameters may be utilized to obtain an estimate of load impedance (e.g., an impedance of the plasma in the chamber 104), which may be reported to the analysis portion for reporting, via the man-machine interface 114, to a user. Additionally, the measures parameters may be utilized to close feedback to the RF generator 102 (e.g., based upon a difference between the measured parameter and a set point.)

The second sensor 112 in the embodiment depicted in FIG. 2 may be generally configured to provide a characterization of the plasma in the chamber 104. For example, measurements taken by the sensor 112 may be used to estimate ion energy distribution, electron density, and/or energy distribution, which directly impact results of the processing in the chamber 104. In many embodiments, by way of further example, electrical characteristics (e.g., voltage, current, impedance) measured at an input 111 to the chamber 104 can be used to predict values of associated plasma parameters. For example, measurements from the second sensor 112 may be used in connection with known information (e.g., information indicating how a deviation from a particular voltage would, or would not, affect one or more plasma parameter(s)). Although not depicted in FIG. 2, the sensors 110, 112 may include a transducer, electronics, and processing logic (e.g., instructions embodied in software, hardware, firmware or a combination thereof).

In many embodiments (e.g., as discussed in more detail further herein), the samples taken by the sensor 100 and/or sensor 112 are digitized and then analyzed in the digital domain. In other embodiments, however, the sampled parameter values are analyzed in the analog domain.

The analysis portion 108 is generally configured to receive information (e.g., information about parameters of power) from the sensors 110, 112 and convey the information to a user via the man-machine interface 114. The analysis portion 108 may be realized by a general purpose computer in connection with software, or dedicated hardware and/or firmware.

Figure 3:
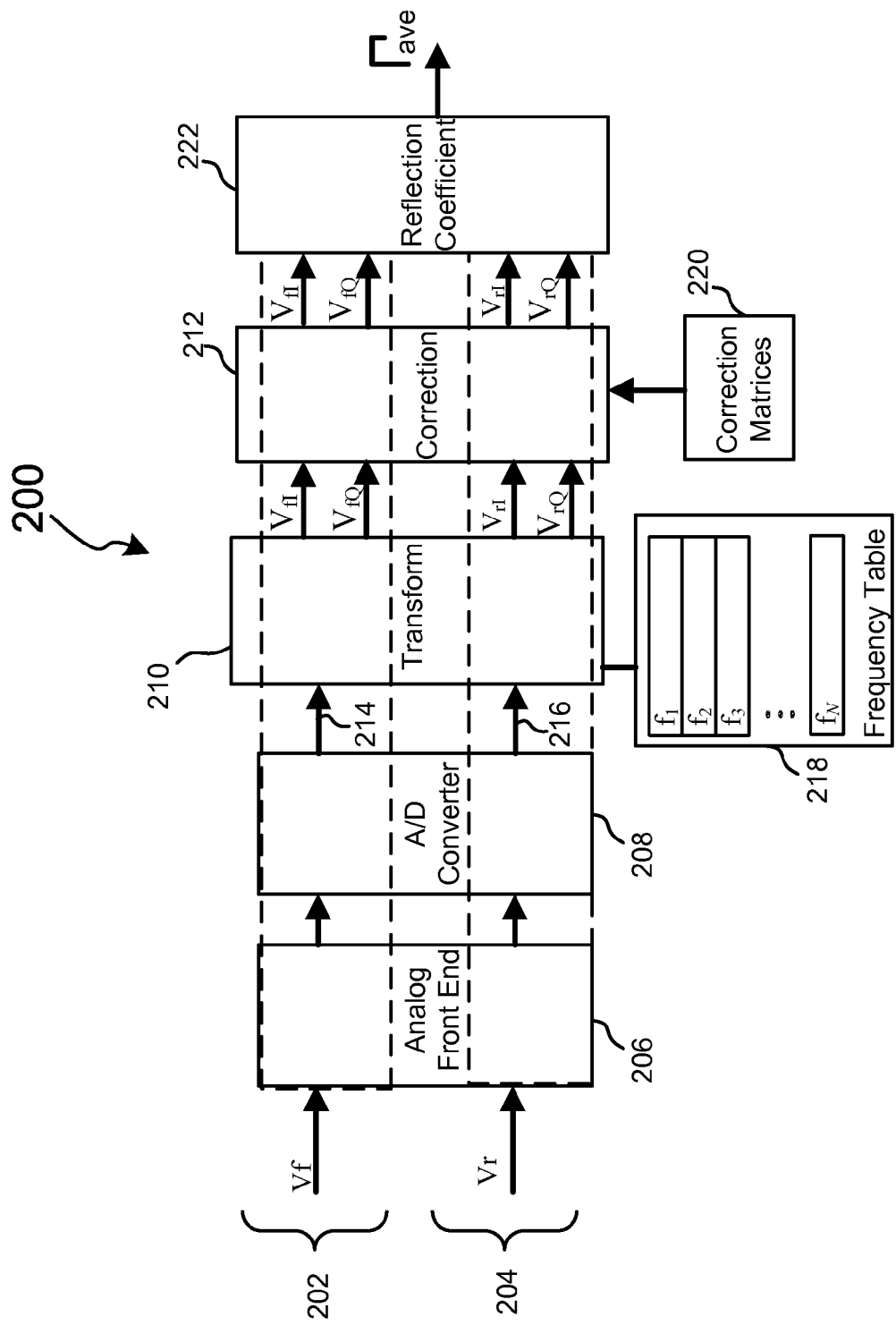
FIG. 3 is a block diagram depicting an exemplary embodiment of a processing portion of the sensors described with reference to FIG. 2.

Referring next to FIG. 3, shown is an exemplary embodiment of a processing portion 200, which may be implemented as a portion of one or more of the sensors 110, 112, RF power generator 102, the matching network 106 and the analysis portion 108 described with reference to FIG. 3. By way of example, the functional components depicted in FIG. 3 may be entirely contained within one component (e.g., the RF generator 102 or the sensors 110, 112) or may be distributed among one or more of the other components described with reference to FIG. 3. As shown, the processing portion 200 in this embodiment includes a first and second processing chains 202, 204, and each processing chain 202, 204 includes an analog front end 206, an analog to digital (A/D) converter 208, a transform portion 210, and a correction portion 212.

The depiction of components in FIG. 3 is logical and not meant to be an actual hardware diagram; thus, the components can be combined or further separated in an actual implementation. For example, the A/D converter 208 may be realized by two separate A/D converters (e.g., 14 bit converters), and the transform portion 210 may be realized by a collection of hardware, firmware, and/or software components. In addition, it is contemplated that the reflection coefficient module 222 may be realized by components that are separate from other components of the processing portion 200. In one particular embodiment for example, the transform and correction portions 210, 212 are realized by a field programmable gate array and the reflection coefficient module 222 is realized by a processor in connection with processor-executable code.

In the exemplary embodiment depicted in FIG. 3, the first and second processing chains 202, 204 are configured to receive respective forward-voltage and reverse-voltage analog-RF signals (e.g., from a directional coupler, which may be referred to as a forward and reflected wave sensor). In other embodiments the first and second processing chains 202, 204 may receive voltage and current analog-RF signals. For clarity, the operation of the processing portion 200 is described with reference to a single processing chain, but it should be recognized that corresponding functions in a second processing chain are carried out.

Figure 4:
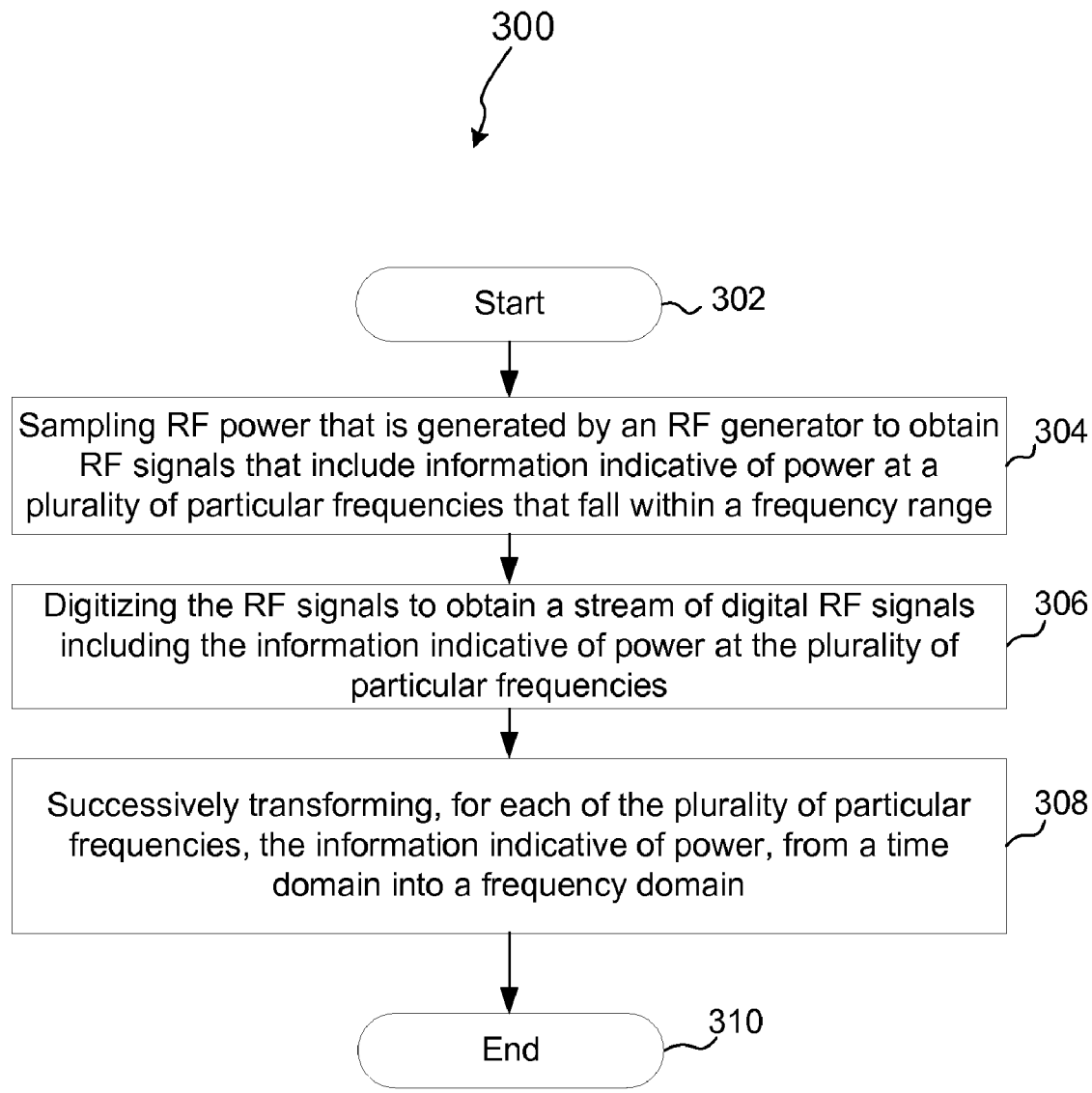
FIG. 4 is a flowchart that depicts an exemplary method for monitoring power that is applied to a plasma load.

While referring to FIG. 3, simultaneous reference will be made to FIG. 4, which is a flowchart 300 that depicts an exemplary method for monitoring power that is applied to a plasma load. It should be recognized, however, that the method depicted in FIG. 4 is not limited to the specific embodiment depicted in FIG. 3. As shown in FIG. 4, RF power that is generated by an RF generator (e.g., the RF generator 102) is sampled to obtain RF signals that include information indicative of power at a plurality of particular frequencies that fall within a frequency range (Blocks 300, 302).

For example, the frequency range may include the range of frequencies from 400 kHz to 60 MHz, but this range may certainly vary depending upon, for example, the frequencies of the RF generator(s) that provide power to the system. The plurality of particular frequencies may be frequencies of a particular interest, and these frequencies, as discussed further herein, may also vary depending upon the frequencies of power that are applied to a processing chamber (e.g., processing chamber 104). For example, particular frequencies may be fundamental frequencies, second and third harmonics of each of the frequencies; and intermodulation frequencies.

As shown with reference to FIG. 3, the analog front end 206 of the first processing chain 202 is configured to receive a forward-voltage analog-RF signal from a transducer (not shown) and prepare the analog RF signal for digital conversion. The analog front end 206, for example, may include a voltage divider and prefilter. As shown, once the analog-RF signal is processed by the analog front end 206, it is digitized by the A/D converter 208 to generate a stream of digital RF signals that includes the information indicative of power at the plurality of particular frequencies (Block 306). In some embodiments for example, 64 million samples are taken of the analog-RF signal per second with 14-bit accuracy.

As shown, once the sampled RF signals are digitized, the information indicative of power (in digital form) is successively transformed, for each of the plurality of particular frequencies, from a time domain into a frequency domain (Block 308). As an example, the transform portion 210 depicted in FIG. 3 receives the streams of digital RF signals 214, 216 and successively transforms the information in each of the digital streams 214, 216 from a time domain to a frequency domain, and provides both in-phase and quadrature information for both the forward voltage stream and the reflected voltage steam.

Although not required, the transform portion 210 in some embodiments is realized by a field programmable gate array (FPGA), which is programmed to carry out, at a first moment in time, a fourier transform (e.g., a digital fourier transform ((DFT)) at one frequency, and then carry out a fourier transform, at a subsequent moment in time, at another frequency so that fourier transforms are successively carried out, one frequency at a time. Beneficially, this approach is faster and more accurate that attempting to take a fourier transform over the entire range of frequencies (e.g., from 400 kHz to 60 MHz) as is done in prior solutions.

In the embodiment depicted in FIG. 3, the particular frequencies $f_{1-N}$ at which successive transforms of the digital RF signals are taken are stored in a table 218 that is accessible by the transform portion 210. In variations of this embodiment, a user is able to enter the particular frequencies $f_{1-N}$ (e.g., using the man-machine interface 114 or other input means). The particular frequencies $f_{1-N}$ entered may be frequencies of interest because, for example, the frequencies affect one or more plasma parameters. As an example, if two frequencies are applied to a chamber (e.g., utilizing two generators), there may be 8 frequencies of interest: the two fundamental frequencies; the second and third harmonics of each of the frequencies; and the two intermodulation products of the two frequencies.

In some embodiments, 256 samples of each of the digital streams 214, 216 are utilized to generate a Fourier transform, and in many embodiments the data rate of the digital streams 214, 216 is 64 Mbs. It is contemplated, however, that the number of samples may be increased (e.g., to improve accuracy) or decreased (e.g., to increase the rate at which information in the streams is transformed). Beneficially, in many implementations of the transform portion 210, the digital streams 214, 216 are continuous data streams (e.g., there is no buffering of the data) so that a transform, at each of the particular frequencies (e.g., frequencies $f_{1-N}$) is quickly carried out (e.g., every micro second).

As shown in the embodiment depicted in FIG. 2, the transform portion 210 provides two outputs (e.g., in phase information and quadrature information) for each of the digital forward and reflected voltage streams 214, 216, and each of the four values are then corrected by the correction portion 212. As depicted in FIG. 3, in some embodiments, correction matrices 220 are utilized to correct the transformed information from the transform portion 210. For example, each of the four values provided by the transform portion 210 are multiplied by a correction matrix that is stored in memory (e.g., non-volatile memory).

In many embodiments the matrices 220 are the result of a calibration process in which known signals are measured and correction factors are generated to correct for inaccuracies in a sensor. In one embodiment, the memory includes one matrix for each of 125 megahertz, and each of the matrices is a 2×4 matrix. And in variations, a separate matrix is used for each of impedance and power; thus 250, 2×4 matrices are utilized in some variations. As shown, after correction by the correction portion 212, four outputs, representing corrected in-phase and quadrature representations of forward and reflected voltage are output and provided to a reflection coefficient module 222.

In this embodiment, the reflection coefficient module 222 receives values for both forward and reflected voltage from the correction portion 212 and calculates a reflection coefficient (e.g., an average reflection coefficient) that may be utilized to estimate an impedance of the plasma load. Although not required, the reflection coefficient module 222 may be realized by executable code (e.g., embodied in software) that is executed by a microprocessor. And the computational resources required to calculate the average reflection coefficient may be reduced by a novel approach discussed further herein.

In some embodiments, a look-up table (e.g., of sine and cosine functions) is utilized to carry out a fourier transform in the transform portion 210. Although fourier transforms may be carried out relatively quickly using this methodology, the amount of stored data may be unwieldy when a relatively high accuracy is required.

Figure 5:
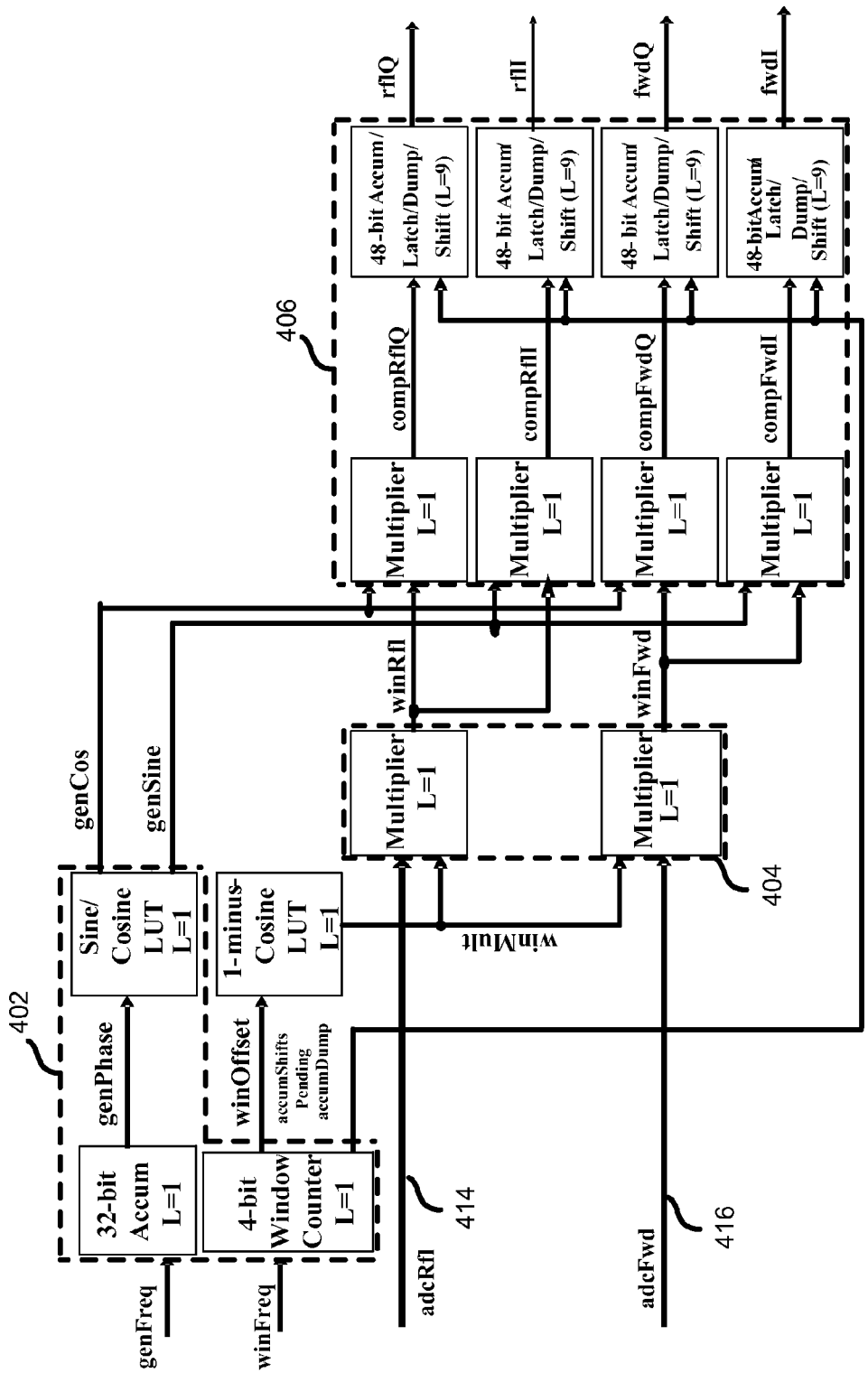
FIG. 5 is a block diagram depicting an exemplary embodiment of the transform portion depicted in FIG. 3.

In other embodiments, direct digital synthesis (DDS) is utilized in connection with the transform of data. Referring to FIG. 5, for example, it is a block diagram depicting an exemplary embodiment of the transform portion 210 depicted in FIG. 2. While referring to FIG. 5, simultaneous reference will be made to FIG. 6, which is a flowchart depicting an exemplary method for performing a transform of sampled RF data. As shown, in the exemplary embodiment depicted in FIG. 5, a particular frequency is selected (e.g., one of the particular frequencies $f_{1-N}$ described with reference to FIG. 3) (Blocks 500, 502), and a direct digital synthesis portion 402 synthesizes a sinusoidal function for the frequency Block 504). In the embodiment depicted in FIG. 5, for example, both a sine and a cosine function are synthesized.

Figure 6:
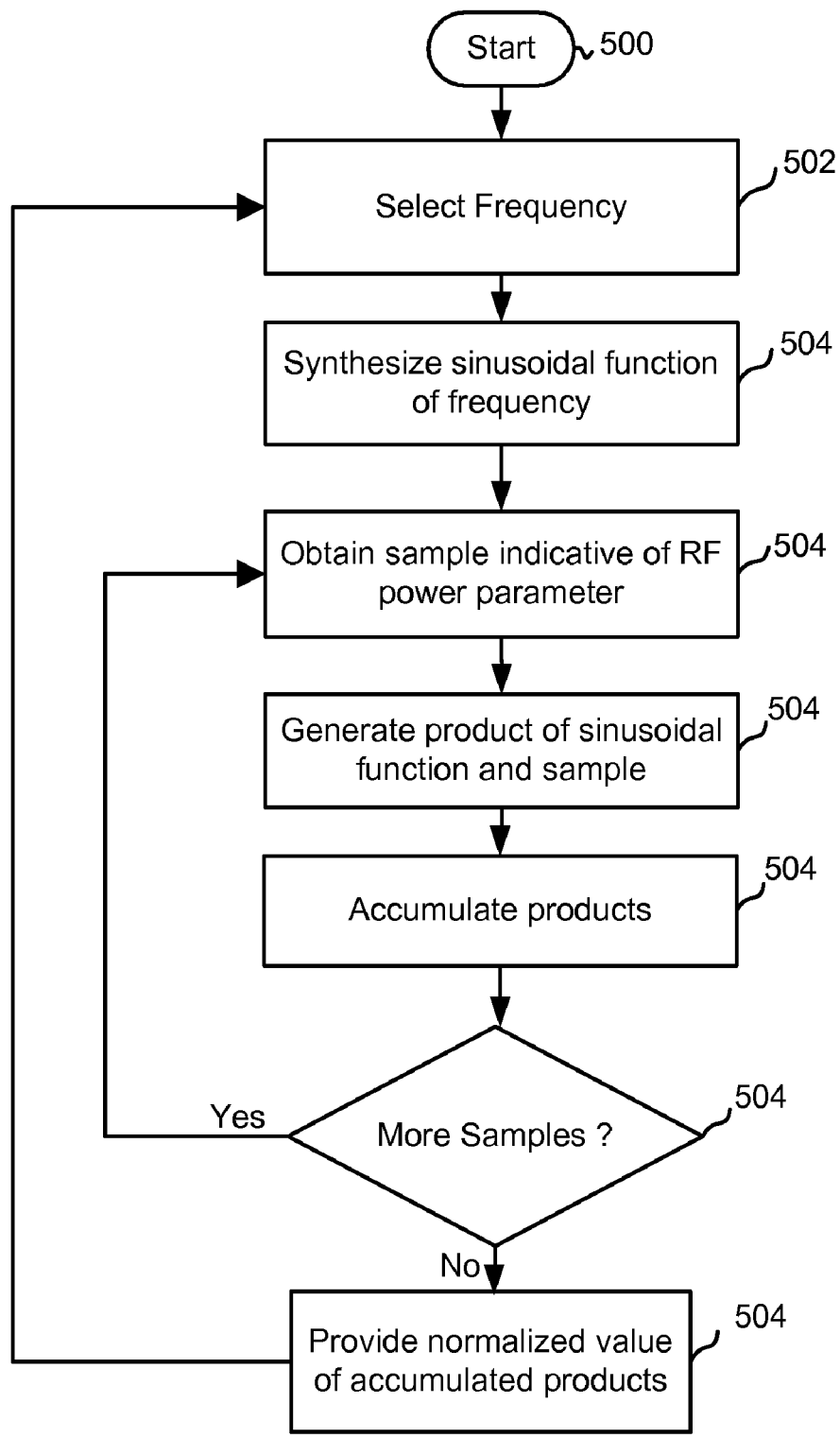
FIG. 6 is a flowchart depicting an exemplary method for performing a transform of sampled RF data.

As shown, a sample indicative of an RF power parameter is obtained (Block 506). In the exemplary embodiment depicted in FIG. 5, digital samples 414, 416 of both forward and reflected voltage are obtained, but in other embodiments other parameters are obtained (e.g., voltage and current). As shown in FIG. 6, for each selected frequency, products of the sinusoidal function at the selected frequency and multiple samples of the RF data are generated (Block 508). In the embodiment depicted in FIG. 5 for example, after a windowing function 404 is carried out on the digital RF samples 414, 416 (e.g., obtained from the A/D converter), the sine and cosine functions generated by the DDS 402 are multiplied by each sample by multipliers in a digital fourier transform portion 406.

As shown, the products of the sinusoidal function and the samples are accumulated (Block 510) (e.g., by accumulators in the digital fourier transform portion 406), and once a desired number of digital RF samples are utilized (Block 512), a normalized value of the accumulated products is provided (Block 514). In some embodiments 64 samples are utilized and in other embodiments 256 are utilized. In yet other embodiments other numbers of digital RF samples are utilized to obtain the value of a parameter (e.g., forward or reflected voltage) at a particular frequency.

As shown in FIG. 6, for each particular frequency (e.g., each of the N frequencies in table 218) Blocks 502-514 are carried out so that a transforms of the sampled RF data are successively carried out for each frequency of interest. In one embodiment, the DDS 402, windowing 404 and DFT 406 portions are realized by an FPGA. But this is certainly not required, and in other embodiments the DDS portion 402 is realized by dedicated chip and the windowing 404 and DFT 406 portions are implemented separately (e.g., by an FPGA).

Figure 7:
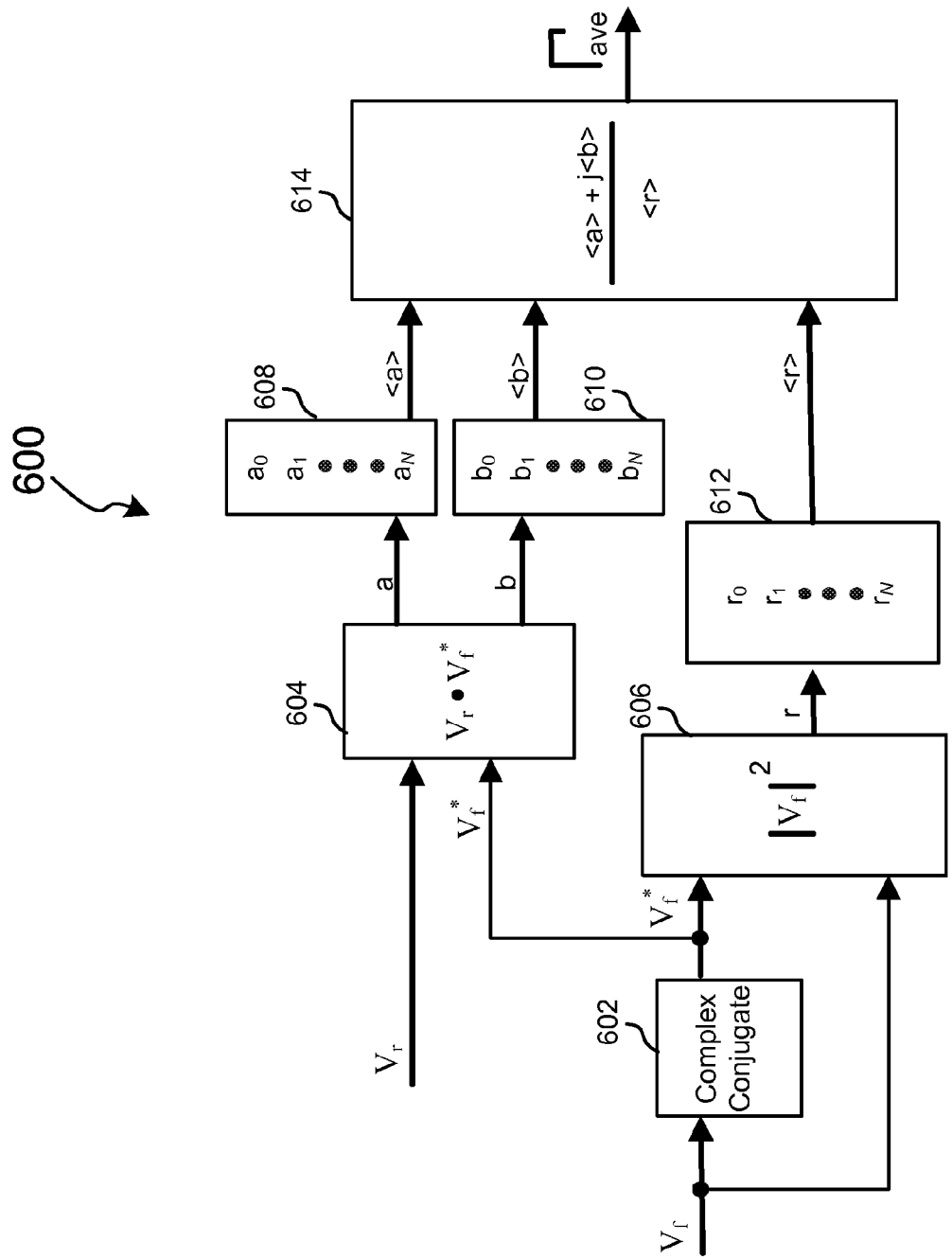
FIG. 7 is a block diagram depicting functional components, which may be utilized to realize the reflection coefficient module described with reference to FIG. 3.

Referring next to FIG. 7, shown is a block diagram depicting functional components of an exemplary reflection coefficient module 600 that may be used to realize the reflection coefficient module 222 described with reference to FIG. 2. While referring to FIG. 7, simultaneous reference will be made to FIG. 8, which is a flow chart depicting an exemplary method that may be utilized in connection with the reflection coefficient module 600.

The depiction of components in FIG. 7 is logical and not meant to be an actual hardware diagram; thus, the components can be combined or further separated in an actual implementation. The components depicted in FIG. 600 may be realized by a collection of hardware, firmware, and/or software components. In one particular embodiment for example, the reflection coefficient module 600 is realized by software that is executed by a microprocessor.

As shown, the reflection coefficient module 600 initially receives N parameter-value pairs, and each of the parameter-value pairs including a first parameter value (e.g., reflected voltage) and a second parameter value (e.g., forward voltage) obtained from samples of RF power that is applied to a plasma load (Blocks 700, 702). In some embodiments, the parameter-value pairs (e.g., forward and reflected voltage values) are obtained utilizing one or more of the process(es) described with reference to FIGS. 3-6, but in other embodiments, other known techniques for obtaining values of a pair of parameters are utilized.

Figure 8:
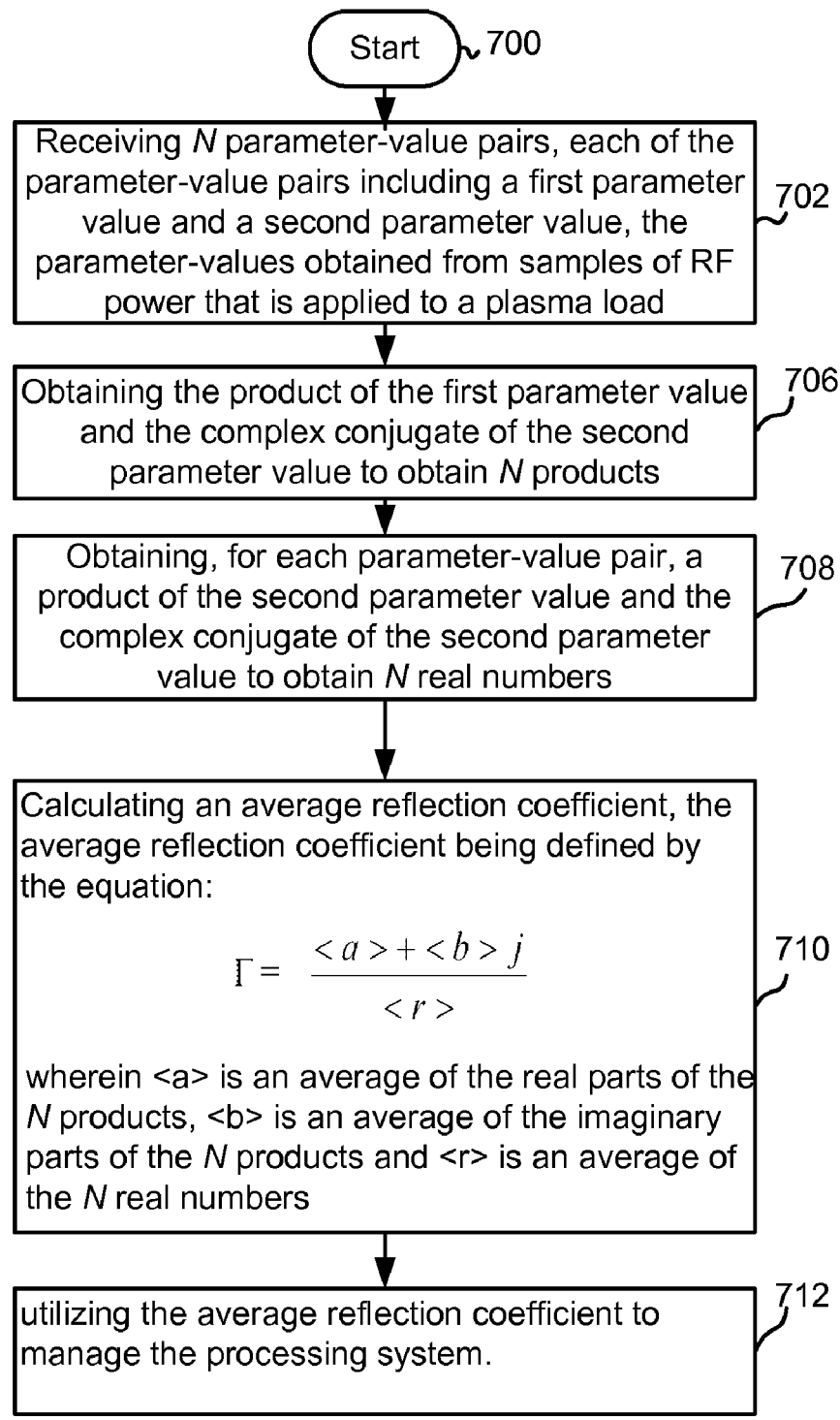
FIG. 8 is a flowchart depicting an exemplary method for calculating an average reflection coefficient, which may be utilized in connection with many embodiments.

As depicted in FIG. 8, the product of the first parameter value and the complex conjugate of the second parameter value are then utilized to obtain N products. Referring to FIG. 7 for example, a complex conjugate of forward voltage is determined by a complex conjugate portion 602 and the complex conjugate of the forward voltage is provided to a multiplier 604, which multiplies the complex conjugate of the forward voltage times the reflected voltage to provide N products that are each defined by a real portion a and an imaginary portion b.

In addition, for each parameter-value pair, a product of the second parameter value and the complex conjugate of the second parameter value are utilized to obtain N real numbers (Block 708). Referring again to FIG. 7, a multiplier 606 receives and multiplies the forward voltage and the complex conjugate of the forward voltage to obtain N real numbers r.

As shown in FIG. 8, an average reflection coefficient is then calculated as follows in Equation 1:

$$\Gamma = \frac{<a> + <b>j}{<r>}$$

wherein $<a>$ is an average of the real parts of the N products, $<b>$ is an average of the imaginary parts of the N products and $<r>$ is an average of the N real numbers (Block 710). As depicted in FIG. 7 for example, the real parts a of the N products are averaged by accumulator 608; the imaginary parts b of the N products are average by accumulator 610; and the N real numbers r are averaged by accumulator 612. And the divider 614 provides the average reflection coefficient in accordance with Equation 1. The average reflection coefficient may then be used in connection with management of the processing system. For example, the average reflection coefficient may be provided to a user of the processing system, may used to calibrate the system, and may be used in connection with matching the plasma load with the impedance of the generator.

Beneficially, the structure and method used to arrive at an average reflection coefficient outlined with reference to FIGS. 7 and 8 requires only two division operations (e.g., one division calculates $<a>/<r>$ for the real part and the other division calculates $<b>/<r>$ for the imaginary part) for a given sample window (e.g., one millisecond) as opposed to known techniques that require hundreds of computationally intensive division operations (e.g., of each reflected power sample by each forward power sample) over the same sample window. As a consequence, the structure and method described with reference to FIGS. 7 and 8 enables an average reflection coefficient to be calculated with fewer system resources than known techniques.

In conclusion, the present invention provides, among other things, a system and method for monitoring a processing system. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. An apparatus for monitoring power applied to a plasma load comprising:
    a first input configured to receive RF samples of power that is applied to the plasma load, the RF samples including information indicative of N parameter-value pairs, each of the N parameter-value pairs including a first parameter value and a second parameter value;
    a reflection coefficient module configured to:
        obtain, for each parameter-value pair, the product of the first parameter value and the complex conjugate of the second parameter value to obtain N products, each of the N products defined by a real part and an imaginary part;
        obtaining, for each parameter-value pair, a product of the second parameter value and the complex conjugate of the second parameter value to obtain N real numbers;
        calculating an average reflection coefficient $\Gamma$, the average reflection coefficient $\Gamma$ being defined by the equation:

$$\Gamma = \frac{<a> + <b>j}{<r>}$$

wherein $<a>$ is an average of the real parts of the N products, $<b>$ is an average of the imaginary parts of the N products and $<r>$ is an average of the N real numbers.

2. The apparatus of claim 1, wherein the reflection coefficient module includes a processor and memory, and wherein the processor is configured to execute processor-readable instructions to calculate the average reflection coefficient $\Gamma$.

3. The apparatus of claim 1, wherein the first parameter value includes a reflected voltage value and the second parameter value includes a forward voltage value.

4. The apparatus of claim 1, wherein the first parameter includes a current value, and the second parameter includes a voltage value.

5. The apparatus of claim 1, including:
    an analog to digital converter configured to digitizing the sampled RF power to obtain a stream of digital RF signals, the digital RF signals including N digital parameter-value pairs.

6. The apparatus of claim 1, including a display configured to display the average reflection coefficient.

7. An apparatus for monitoring a processing system, the apparatus comprising:
    means for sampling RF power that is applied to a plasma load to obtain N parameter-value pairs, each of the parameter-value pairs including a first parameter value and a second parameter value;

means for obtaining, for each parameter-value pair, the product of the first parameter value and the complex conjugate of the second parameter value to obtain N products, each of the N products defined by a real part and an imaginary part;

means for obtaining, for each parameter-value pair, a product of the second parameter value and the complex conjugate of the second parameter value to obtain N real numbers;

means for calculating an average reflection coefficient $\Gamma$, the average reflection coefficient $\Gamma$ being defined by the equation:

$$\Gamma = \frac{<a> + <b>j}{<r>}$$

wherein $<a>$ is an average of the real parts of the N products, $<b>$ is an average of the imaginary parts of the N products and $<r>$ is an average of the N real numbers; and means for utilizing the average reflection coefficient $\Gamma$ to manage the processing system.

8. The apparatus of claim 7, wherein the first parameter value includes a reflected voltage value and the second parameter value includes a forward voltage value.

9. The apparatus of claim 7, wherein the first parameter includes a current value, and the second parameter includes a voltage value.

10. The apparatus of claim 7, including:
means for digitizing the sampled RF power to obtain a stream of digital RF signals;
means for down-converting, for each of a plurality of particular frequencies, the stream of digital RF signals to obtain N parameter-value pairs for each of the plurality of particular frequencies.

11. The apparatus of claim 7, including means for sampling the RF power at an output of an RF generator supplying power to the plasma load.

12. The apparatus of claim 7, including means for sampling the RF power at an input to a plasma chamber that contains the plasma load.

* * * * *